(12) United States Patent
Luo et al.

(10) Patent No.: US 10,884,061 B2
(45) Date of Patent: Jan. 5, 2021

(54) RELAY DIAGNOSIS CIRCUIT, DIAGNOSIS METHOD, AND BATTERY MANAGEMENT SYSTEM

(71) Applicant: Contemporary Amperex Technology Co., Limited, Ningde (CN)

(72) Inventors: Jiechao Luo, Ningde (CN); Wei Zhang, Ningde (CN); Zhanyu Sun, Ningde (CN); Yizhen Hou, Ningde (CN); Zhimin Dan, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 83 days.

(21) Appl. No.: 16/112,719

(22) Filed: Aug. 26, 2018

(65) Prior Publication Data
US 2019/0064285 A1    Feb. 28, 2019

(30) Foreign Application Priority Data
Aug. 29, 2017    (CN) .......................... 2017 1 0757999

(51) Int. Cl.
*G01R 31/364*    (2019.01)
*G01R 31/327*    (2006.01)
(Continued)

(52) U.S. Cl.
CPC ....... *G01R 31/364* (2019.01); *G01R 31/3274* (2013.01); *G01R 31/3648* (2013.01); *G01R 31/3275* (2013.01); *H01H 47/002* (2013.01)

(58) Field of Classification Search
CPC ............ G01R 31/3274; G01R 31/3275; G01R 31/3278; G01R 31/364
See application file for complete search history.

(56) References Cited

U.S. PATENT DOCUMENTS

2014/0095093 A1*  4/2014  Hong ..................... G01R 31/50
                                                                   702/63
2014/0159908 A1   6/2014  Hong et al.
(Continued)

FOREIGN PATENT DOCUMENTS

CN    203365648 U    12/2013
CN    104090229 A    10/2014
(Continued)

OTHER PUBLICATIONS

The First Official Action and search report dated Apr. 30, 2019 for Chinese Application No. 201710757999.8, 8 pages.
(Continued)

*Primary Examiner* — Noam Reisner
(74) *Attorney, Agent, or Firm* — Law Offices of Liaoteng Wang

(57) ABSTRACT

A relay diagnosis circuit, diagnosis method, and battery management system are disclosed in the present disclosure. The relay diagnosis circuit may include a first sampling unit, a second sampling unit, a first sampling point, a second sampling point, a reference voltage terminal, and a processor. A first end of the first sampling unit is connected with voltage output end of the power battery pack to be measured and a first end of a relay. A second end of the first sampling unit is connected with the reference voltage terminal and the first sampling point. A first end of the second sampling unit is connected with a second end of the relay. A second end of the second sampling unit is connected with the reference voltage terminal and the second sampling point.

8 Claims, 5 Drawing Sheets

(51) Int. Cl.
    *H01H 47/00*     (2006.01)
    *G01R 31/36*     (2020.01)

(56) References Cited

U.S. PATENT DOCUMENTS

| | | | | |
|---|---|---|---|---|
| 2016/0154064 A1* | 6/2016 | Klein | ............... | G01R 31/3277 324/433 |
| 2016/0169945 A1* | 6/2016 | Mauder | ............... | G01R 31/3274 324/126 |
| 2018/0188326 A1* | 7/2018 | Huh | ............... | G01R 19/16504 |
| 2018/0240629 A1* | 8/2018 | Ao | ............... | B60L 58/10 |

FOREIGN PATENT DOCUMENTS

| | | |
|---|---|---|
| CN | 104678296 A | 6/2015 |
| CN | 105652190 A | 6/2016 |
| CN | 106338688 A | 1/2017 |
| CN | 107526041 A | 12/2017 |
| CN | 107576914 A | 1/2018 |
| CN | 107728066 A | 2/2018 |
| CN | 108469584 A | 8/2018 |
| DE | 102006050529 A1 | 4/2008 |
| DE | 102011004516 A1 | 8/2012 |
| EP | 3367411 A1 | 8/2018 |

OTHER PUBLICATIONS

The extended European search report dated Jan. 25, 2019 for European Application No. 18190812.0, 13 pages.
The second Official Action and supplemental search report dated Dec. 18, 2019 for Chinese Application No. 201710757999.8, 9 pages.
Nan Jin et al., "Research on AC Chopper Power Converter and its Control Technology", Henan Science and Technology Press, dated Oct. 31, 2015, 7 Pages.
The third Office Action dated Nov. 16, 2020 for European Application No. 18190812.0, 15 pages.

* cited by examiner

RELAY DIAGNOSIS CIRCUIT, DIAGNOSIS METHOD, AND BATTERY MANAGEMENT SYSTEM

CROSS REFERENCE TO RELATED APPLICATION

The present application is based upon and claims the benefits of Chinese Patent Application No. CN 201710757999.8 filed on Aug. 29, 2017, the entire contents of which are incorporated herein by reference.

FIELD

The present disclosure generally relates to batteries, and more particularly to a relay diagnosis circuit, diagnosis method, and battery management system.

BACKGROUND

Power battery pack is responsible for storing and supplying power. Typically, the power battery pack may control voltage output through a positive relay and a negative relay. In use, it is necessary to design a relay diagnosis circuit to diagnose whether there is failure in the positive relay and the negative relay, thus avoiding security issues of the power battery pack due to failure of the positive relay and the negative relay.

Currently, in the relay diagnosis circuit, the power battery pack and a sampling unit are set in non-common-ground-connection. In particular, non-common-ground-connection means that the positive electrode and the negative electrode of the power battery pack are grounded with high voltage, and the sampling unit is ground with low voltage. An isolation unit is provisioned behind the sampling unit, in order to isolate interference from a high-voltage grounded signal of the power battery pack to a sampled signal of the sampling unit.

However, inventors of the present application have realized that the isolation unit of prior arts also introduces a new interference signal while isolating the high-voltage grounded signal of the power battery pack, which results in a decrease in the accuracy of the sampled signal.

SUMMARY

The present disclosure provides a relay diagnosis circuit, diagnosis method, and battery management system, which are able to connect a power battery pack and a sampling unit in common ground, so that it is not necessary to introduce an isolation unit, and thus the accuracy of the sampled signal can be improved.

In a first aspect, a relay diagnosis circuit for a power battery pack is provided in embodiments of the present disclosure. The relay diagnosis circuit includes a first sampling unit, a second sampling unit, a first sampling point, a second sampling point, a reference voltage terminal, and a processor, wherein a first end of the first sampling unit is connected with voltage output end of the power battery pack to be measured and a first end of a relay, a second end of the first sampling unit is connected with the reference voltage terminal and the first sampling point, and the first sampling unit is configured to provide a first sampled signal for the second sampling point; wherein a first end of the second sampling unit is connected with a second end of the relay, a second end of the second sampling unit is connected with the reference voltage terminal and the second sampling point, and the second sampling unit is configured to provide a second sampled signal for the second sampling point; and wherein the processor is connected with the first sampling point and the second sampling point respectively, and the processor is configured to obtain a diagnosis result of the relay based on the first sampled signal and the second sampled signal.

In some embodiments of the first aspect, the first sampling unit includes a first switch, a first resistor network, and a second resistor network which are connected in series, wherein a first end of the first switch is connected with the voltage output end of the power battery pack to be measured and the first end of the relay, a second end of the first switch is connected with a first end of the first resistor network; wherein a second end of the first resistor network is connected with a first end of the second resistor network and the first sampling point; and wherein a second end of the second resistor network is connected with the reference voltage terminal.

In some embodiments of the first aspect, the second sampling unit includes a second switch, a third resistor network, and a fourth resistor network which are connected in series, wherein a first end of the second switch is connected with the second end of the relay, and a second end of the second switch is connected with a first end of the third resistor network; wherein a second end of the third resistor network is connected with a first end of the fourth resistor network and the second sampling point; and wherein a second end of the fourth resistor network is connected with the reference voltage terminal.

In some embodiments of the first aspect, when the relay is a negative relay, the relay diagnosis circuit further includes a voltage pull-up unit which is connected with the first sampling point and the second sampling point.

In some embodiments of the first aspect, the voltage pull-up unit includes a DC voltage source, a fifth resistor network, and a sixth resistor network, wherein a first end of the fifth resistor network is connected with the DC voltage source, and a second end of the fifth resistor network is connected with the first sampling point; wherein a first end of the sixth resistor network is connected with the DC voltage source, and a second end of the sixth resistor network is connected with the second sampling point; and wherein the voltage pull-up unit is configured to generate a pull-up voltage and pull the first and the second sampled signals up to positive voltage signals respectively using the pull-up voltage.

In some embodiments of the first aspect, the relay diagnosis circuit further includes a first analog-to-digital converter (ADC), wherein a first end of the first ADC is connected with the first sampling point and the second sampling point, a second end of the first ADC is connected with the processor, and the first ADC is configured to convert analog signals collected at the first sampling point and the second sampling point to digital signals.

In a second aspect, there is provided a battery management system which includes the above described relay diagnosis circuit in embodiments of the present disclosure.

In a third aspect, there is provided a diagnosis method for relay diagnosis circuit used in the above described relay diagnosis circuit. The diagnosis method includes: obtaining the first sampled signal from the first sampling point and obtaining the second sampled signal from the second sampling point; and obtaining the diagnosis result of the relay based on the first sampled signal and the second sampled signal.

In some embodiments of the third aspect, obtaining the first sampled signal from the first sampling point and obtaining the second sampled signal from the second sampling point includes: having both of the first switch and the second switch in ON state to obtain the first sampled signal from the first sampling point and obtain the second sampled signal from the second sampling point.

In some embodiments of the third aspect, obtaining the diagnosis result of the relay based on the first sampled signal and the second sampled signal includes: converting the first sampled signal to a first sampled voltage; converting the second sampled signal to a second sampled voltage; calculating difference between the first sampled voltage and the second sampled voltage to obtain coil-voltage-drop of the relay; comparing the coil-voltage-drop of the relay and a preset coil-voltage-drop threshold to obtain a comparison result of the coil-voltage-drop; and obtaining the diagnosis result of the relay based on the comparison result of the coil-voltage-drop.

The relay diagnosis circuit disclosed in embodiments of the present disclosure may include a first sampling unit, a second sampling unit, a first sampling point, a second sampling point, a reference voltage terminal, and a processor. An end of the first sampling unit and an end of the second sampling unit are connected with the voltage output end of the power battery pack to be measured respectively. Another end of the first sampling unit and another end of the second sampling unit are connected with the reference voltage terminal. That is, the first sampling unit and the second sampling unit are in low voltage common-ground-connection with the power battery pack. The first sampling unit may be configured to provide a first sampled signal for the first sampling point. The second sampling unit may be configured to provide a second sampled signal for the second sampling point. Diagnosis result of the relay may be obtained based on the first sampled signal and the second sampled signal.

BRIEF DESCRIPTION OF THE DRAWINGS

The present disclosure will be better understood from the following detailed description of the disclosure in conjunction with the accompanying drawings in which like or similar reference numerals refer to like or similar features.

DETAILED DESCRIPTION

Features of various aspects and exemplary embodiments of embodiments of the present disclosure will be described in detail below. In the following detailed description, many specific details are disclosed to provide a thorough understanding of embodiments of the present disclosure. However, it is apparent to a person skilled in the art that embodiments of the present disclosure may be practiced without some of these specific details. The following descriptions of embodiments are merely to provide a better understanding of embodiments of the present disclosure through illustrating examples of embodiments of the present disclosure. Embodiments of the present disclosure is by no means limited to any specific configuration and algorithm disclosed below, but rather covering any modification, substitution, and improvement of elements, components, and algorithms without departing from the spirit of embodiments of the present disclosure. In the appended drawings and the following descriptions, well-known structures and techniques are not illustrated to avoid unnecessarily obscuring embodiments of the present disclosure.

Embodiments of the disclosure provides a relay diagnosis circuit, a diagnosis method, and a battery management system. The relay diagnosis circuit may diagnose whether there is failure in the positive relay and/or negative relay. It is to be noted that the power battery pack to be measured in the embodiments of the present disclosure may be a lithium ion battery, a lithium metal battery, a lead acid battery, a nickel battery, a nickel hydrogen battery, a lithium sulfur battery, a lithium air battery or a sodium ion battery, and the disclosure is not limited in this respect. In terms of scale, the power battery pack to be measured may also be a cell or a battery module or a battery package, which is not limited herein. The battery management system includes the relay diagnosis circuit. Illustratively, the relay diagnosis circuit may be integrated in a battery management system.

Figure 1:
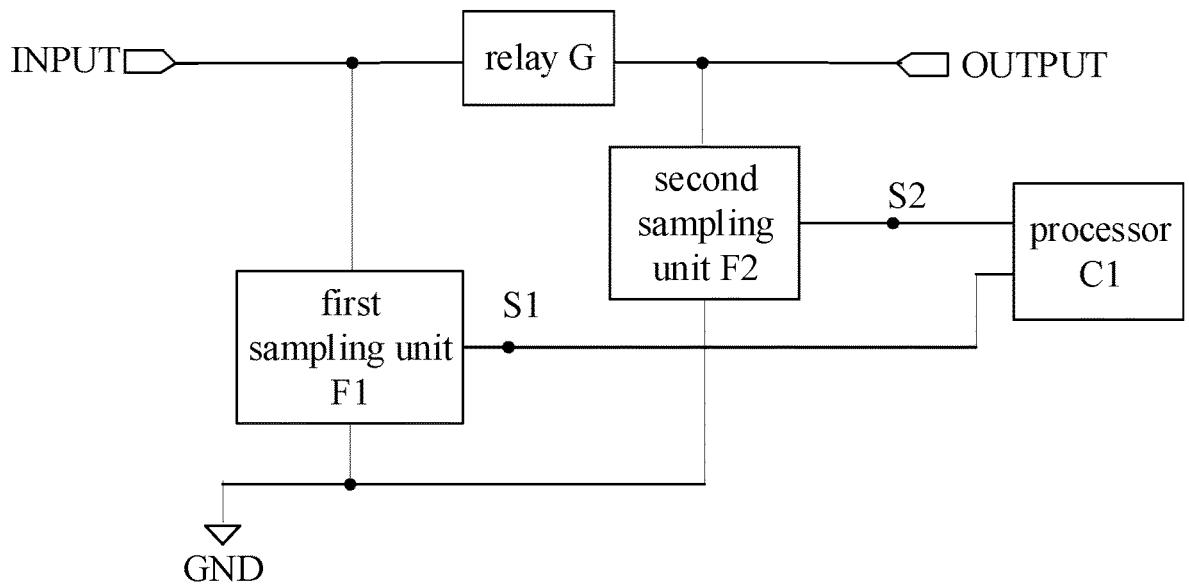
FIG. 1 is a structure diagram of a relay diagnosis circuit according to an embodiment of the present disclosure.

FIG. 1 is a structure schematic of a relay diagnosis circuit according to an embodiment of the present disclosure. As shown in FIG. 1, the relay diagnosis circuit may include a first sampling unit F1, a second sampling unit F2, a first sampling point S1, a second sampling point S2, a reference voltage terminal GND, and a processor C1.

A first end of the first sampling unit F1 is connected with voltage output end of the power battery pack to be measured and a first end of a relay G. A second end of the first sampling unit F1 is connected with the reference voltage terminal GND and the first sampling point S1. The first sampling unit F1 is configured to provide a first sampled signal for the first sampling point S1.

A first end of the second sampling unit F2 is connected with a second end of the relay G. A second end of the second sampling unit F2 is connected with the reference voltage terminal GND and the second sampling point S2. The second sampling unit F2 is configured to provide a second sampled signal for the second sampling point S2.

The processor C1 is connected with the first sampling point S1 and the second sampling point S2 respectively. The processor C1 is configured to acquire diagnosis result of the relay G by calculation according to the first sampled signal and the second sampled signal.

It should be noted that the actual voltage of the reference voltage terminal GND may be set according to working conditions and requirements of the relay diagnosis circuit. However, voltage of the reference voltage terminal GND is used as reference voltage in the relay diagnosis circuit, that is, the reference voltage of the reference voltage terminal GND may be regarded as relative 0V. For example, if the actual voltage of the reference voltage terminal GND is 6V and actual voltage of the sampled signal sampled at the first sampling point S1 is 22V, the reference voltage 6V can be recorded as 0V and the voltage of the sampled signal sampled at the first sampling point S1 is recorded as 16V.

In an embodiment of the present disclosure, an end of the first sampling unit F1 and an end of the second sampling unit F2 are connected with the voltage output end of the power battery pack to be measured respectively. Another end of the first sampling unit F1 and another end of the second sampling unit F2 are connected with the reference voltage terminal. That is, a first loop is formed from the voltage output end of the power battery to be measured through the first sampling unit F1 and the reference voltage terminal GND, and a second loop is formed from the power battery pack through the relay G, the second sampling unit F2 and the reference voltage terminal GND in turn. In other words, the first sampling unit F1 and the second sampling unit F2 are in low voltage common-ground-connection with the power battery pack.

It is to be noted that the first sampling unit F1 is connected to the inside end of the relay G, and the second sampling unit F2 is connected to the outside end of the relay G. The inside end of the relay G refers to an end of the relay G which is inside with respect to the power battery pack to be measured; and the outside end of the relay G refers to an end of the relay G which is outside with respect to the power battery pack to be measured. Coil-voltage-drop between the inside and outside ends of the relay G may be calculated by performing difference processing for the first sampled signal acquired from the first sampling unit F1 and the second sampled signal acquired from the second sampling unit F2.

Compared with the power battery pack and the sampling units being grounded with high voltage and low voltage respectively in prior art, the first sampling unit F1, the second sampling unit F2 are in low voltage common-ground-connection with the power battery pack, so that it is not necessary for the relay diagnosis circuit to introduce the isolation unit. In other words, it is avoided to introduce a new interference signal, and thus the accuracy of the sampled signal can be improved.

In addition, the structure of the relay diagnosis circuit is simplified, since the isolation unit is not required to isolate the interference from the high-voltage grounded signal of the power battery pack to the sampled signal of the sampling units.

Figure 2:
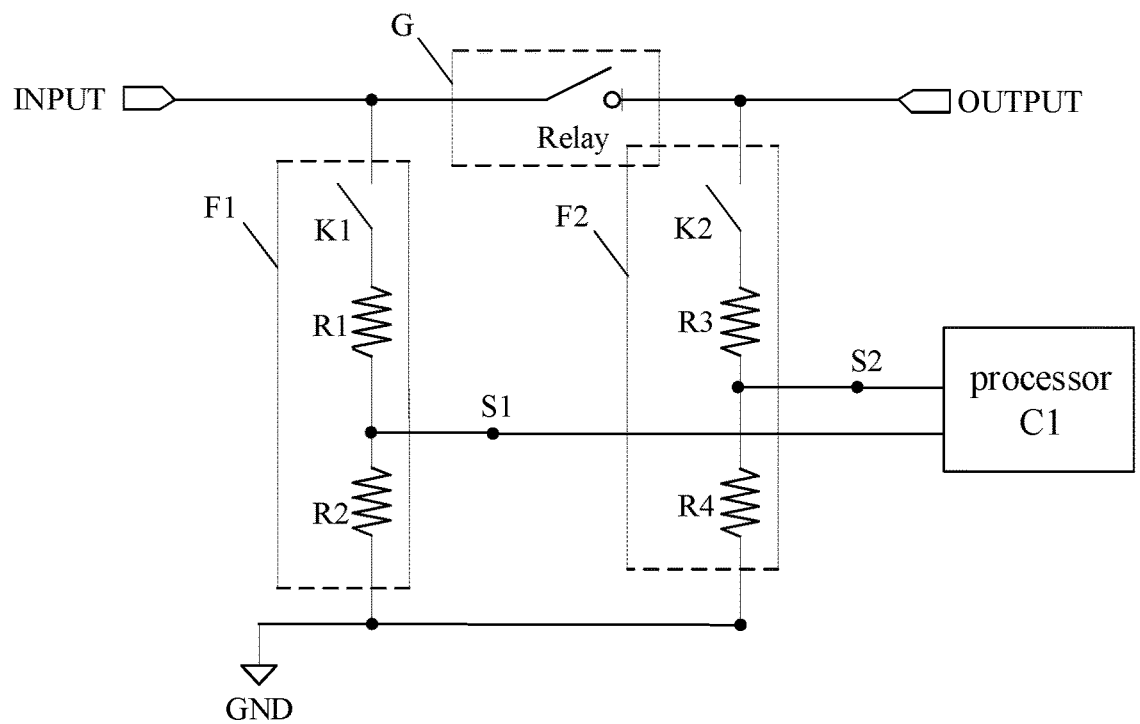
FIG. 2 is a structure diagram of a relay diagnosis circuit according to an example of an embodiment of the present disclosure.

FIG. 2 is a structure diagram of a relay diagnosis circuit according to an example of an embodiment of the present disclosure. As shown in FIG. 2, the first sampling unit F1 and the second sampling unit F2 may be composed of components. Specific structure of the first sampling unit F1 and the second sampling unit F2 will be described below by way of examples.

The first sampling unit F1 may include a first switch K1, a first resistor network R1 and a second resistor network R2 which are connected in series.

A first end of the first switch K1 is connected with the voltage output end of the power battery pack to be measured and the first end of the relay G. A second end of the first switch K1 is connected with a first end of the first resistor network R1. A second end of the first resistor network R1 is connected with a first end of the second resistor network R2 and the first sampling point S1. A second end of the second resistor network R2 is connected with the reference voltage terminal.

The first resistor network R1 and the second resistor network R2 work for voltage dividing. The range of the first sampled signal of the first sampling point S1 can be adjusted by adjusting resistance values of the first resistor network R1 and the second resistor network R2. Illustratively, the form of the resistor network and the resistance value of the first resistor network R1 may be the same as that of the second resistor network R2.

The second sampling unit F2 may include a second switch K2, a third resistor network R3, and a fourth resistor network R4 which are connected in series.

A first end of the second switch K2 is connected with the second end of the relay G. A second end of the second switch K2 is connected with a first end of the third resistor network R3. A second end of the third resistor network R3 is connected with a first end of the fourth resistor network R4 and the second sampling point S2. A second end of the fourth resistor network R4 is connected with the reference voltage terminal.

The third resistor network R3 and the fourth resistor network R4 work for voltage dividing. The range of the second sampled signal of the second sampling point S2 may be adjusted by adjusting resistance values of the third resistor network R3 and the fourth resistor network R4. Illustratively, the form of the resistor network and the resistance value of the third resistor network R3 may be the same as that of the fourth resistor network R4.

It should be noted that the voltage output end of the power battery pack to be measured may include a positive output end and a negative output end. The positive output end may be connected with a positive relay G+ to control the output voltage of positive electrode. The negative output end may be connected with a negative relay G− to control the output voltage of negative electrode.

The diagnosis circuits for the positive relay G+ and the negative relay G− of the power battery pack to be measured will be described below.

In an example, the diagnosis circuit for the positive relay G+ is substantially the same as the circuit structure diagram shown in FIGS. 1 and 2, and the connection relationship of the components is also kept the same. The difference is that only the names of the first sampling unit F1, the second sampling unit F2, the first sampling point S1, and the second sampling point S2 need to be distinguished to highlight the characteristics of the positive electrode. For example, the names of the above-described elements may be adjusted to a first positive sampling unit F11, a second positive sampling unit F21, a first positive sampling point S11, and a second positive sampling point S21 (see FIG. 5).

In another example, the diagnosis circuit of the negative relay is substantially the same as the circuit structure diagram shown in FIGS. 1 and 2, and the connection relationship of the components is also kept the same. The difference is that only the names of the first sampling unit F1, the second sampling unit F2, the first sampling point S1, and the second sampling point S2 need to be distinguished to highlight the characteristics of the negative electrode. For example, the names of the above-described elements may be adjusted to a first negative sampling unit F12, a second negative sampling unit F22, a first negative sampling point S12, and a second negative sampling point S22 (see FIG. 5).

The voltage of the negative sampled signal of the first sampling point S12 and the second sampling point S22 may be smaller than the voltage of the reference voltage terminal GND (i.e., relative 0V) due to voltage drop of current. That is, the negative sampled signal of the first sampling point and the second sampling point may be a negative value.

Figure 3:
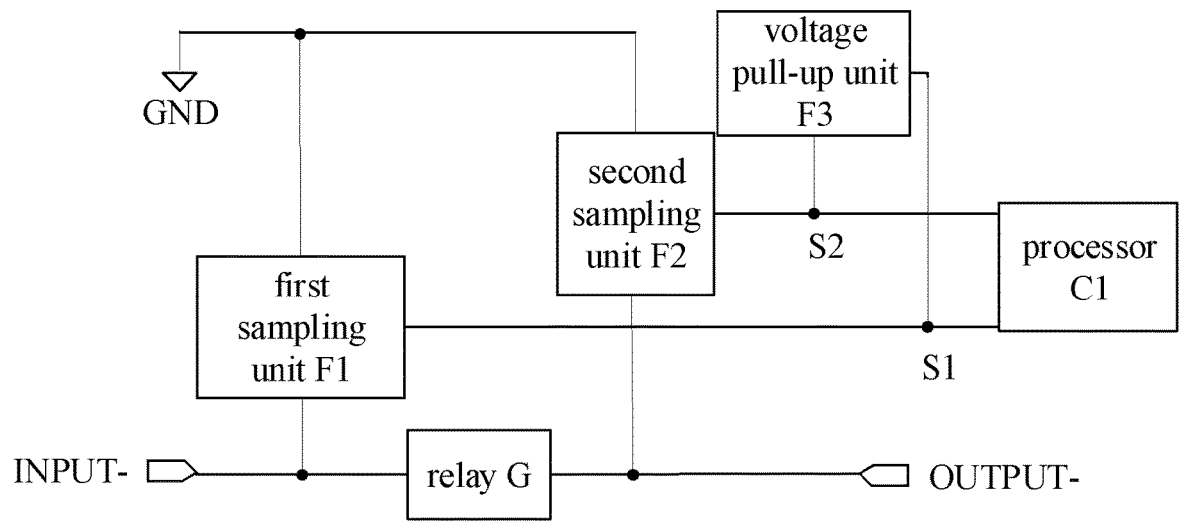
FIG. 3 is a structure diagram of a relay diagnosis circuit according to another embodiment of the present disclosure.

In another example, as shown in FIG. 3, the relay diagnosis circuit may further include a voltage pull-up unit F3 to avoid configuring in the relay diagnosis circuit a structure which is able to process the negative voltage signal. The voltage pull-up unit F3 is connected with the first sampling point S1 and the second sampling point S2. The voltage pull-up unit F3 may be configured to generate a pull-up voltage, and pull the first sampled signal and the second sampled signal up to a positive voltage signal with the pull-up voltage respectively.

Figure 4:
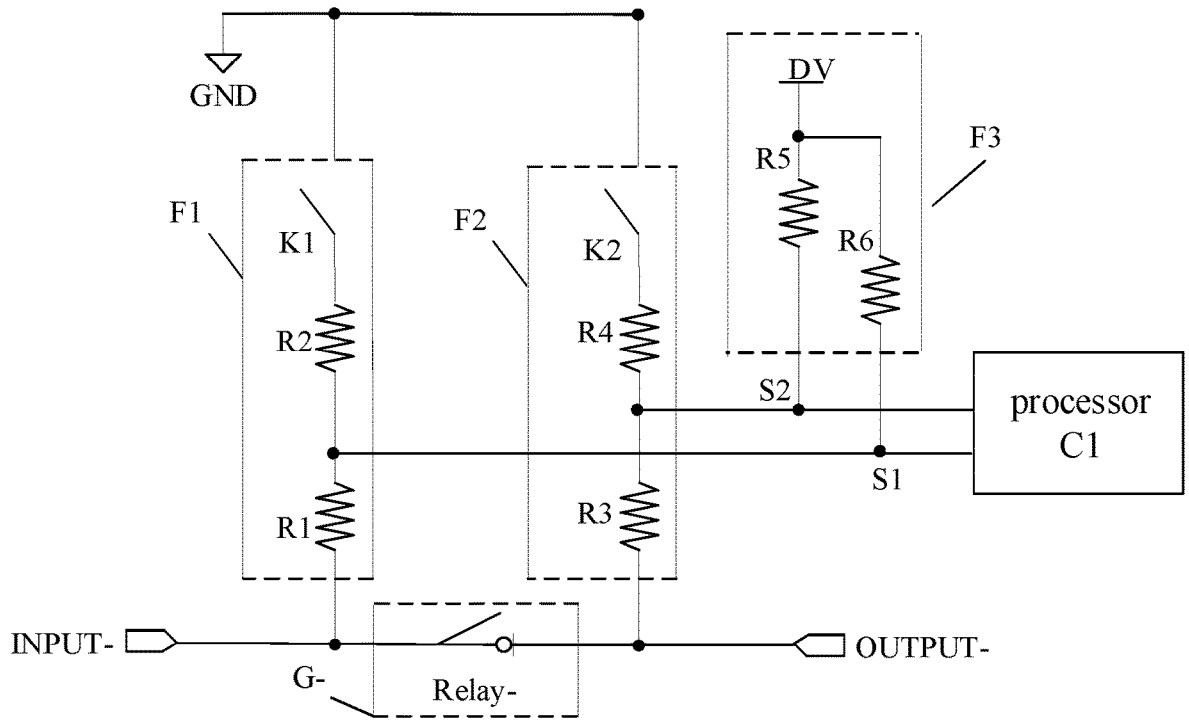
FIG. 4 is a structure diagram of a relay diagnosis circuit according to an example of another embodiment of the present disclosure.

Correspondingly, referring to FIG. 4, the voltage pull-up unit F3 may include a direct current (DC) voltage source DV, a fifth resistor network R5, and a sixth resistor network R6.

A first end of the fifth resistor network R5 is connected with the DC voltage source DV. A second end of the fifth resistor network R5 is connected with the first sampling point S1. A first end of the sixth resistor network R6 is connected with the DC voltage source DV. A second end of the six resistor network R6 is connected with the second sampling point S2. The voltage pull-up unit F3 may be configured to generate a pull-up voltage and pull the first and second sampled signals up to positive voltage signals respectively.

It should be noted that the first resistor network R1 to the fifth resistor network R5 each may include one resistor, and may also include two or more resistors in series and/or in parallel. In the relay diagnosis circuit shown in FIG. 2, the first resistor network R1 to the fifth resistor network R5 each include one resistor.

In an example, the form of resistor network and the resistance value of the first resistor network R1 to the fifth resistive network R5 may be determined based on the sampling range and accuracy of sampling at the first sampling point S1 and the second sampling point S2. The disclosure is not limited in this respect.

In another example, the form of resistor network and the resistance value of the first resistor network R1 to the fifth resistive network R5 may be determined based on normal allowable range of the sampling unit sampled at the first sampling point S1 and the second sampling point S2. The disclosure is not limited in this respect.

In yet another example, the form of resistor network and the resistance value of the first resistor network R1 to the fifth resistive network R5 may also be determined based on the tolerance range of normal operating voltage of the components in the relay diagnosis circuit. The disclosure is not limited in this respect.

In an illustrative example, the form of resistor network and the resistance value of the first resistor network R1 and the third resistor network R3 may be the same. The form of resistor network and the resistance value of the second resistor network R2 and the fourth resistor network R4 may be the same.

Both the first sampling point S1 and the second sampling point S2 may be used to connect to the sampling units. In an example, a sampling unit may be a component capable of implementing sampling function. For example, the sampling unit may be an ADC (Analog-to-Digital Converter).

In an example, the relay diagnosis circuit may further include a first ADC (not shown). A first end of the first ADC is connected with the first sampling point S1 and the second sampling point S2. A second end of the first ADC is connected with the processor C1. The first ADC may be configured to convert analog signals sampled at the first sampling point S1 and the second sampling point S2 to digital signals.

It should be noted that the first sampling point S1 and the second sampling point S2 may each use a separate ADC. Corresponding ADC may convert analog signals sampled at the first sampling point S1 and the second sampling point S2 to digital signals, respectively.

FIGS. 1 to 4 also show the first switch K1 and the second switch K2 in the relay diagnosis circuit.

The first switch K1 may control the first sampling point S1 to provide a first sampled signal, i.e., a sampled signal at the inside end of the relay G. When the first switch K1 is in ON state, the first sampling point S1 may provide a positive sampled signal. When the first switch K1 is in OFF state, the first sampling point S1 may stop supplying the positive sampled signal.

The second switch K2 may control the second sampling point S2 to provide a second sampled signal, i.e., a sampled signal at the outside end of the relay G. When the second switch K2 is in ON state, the second sampling point S2 may provide a positive sampled signal. When the second switch K2 is in OFF state, the negative sampling point S2 stops supplying the positive sampled signal.

It is to be noted that the first switch K1 and the second switch K2 can be set according to specific working scenarios and demands. In an example, any one or more switches of the first switch K1 and the second switch K2 may be provided in the relay diagnosis circuit. The switch may include a component capable of effecting switching function, and the disclosure is not limited in this respect. For example, the switch may be a mechanical switch such as a single-pole-single-throw switch and the like, and also may be an electronic switch such as a triode, a metal-oxide-semiconductor field effect transistor (MOS) transistor and the like.

Figure 5:
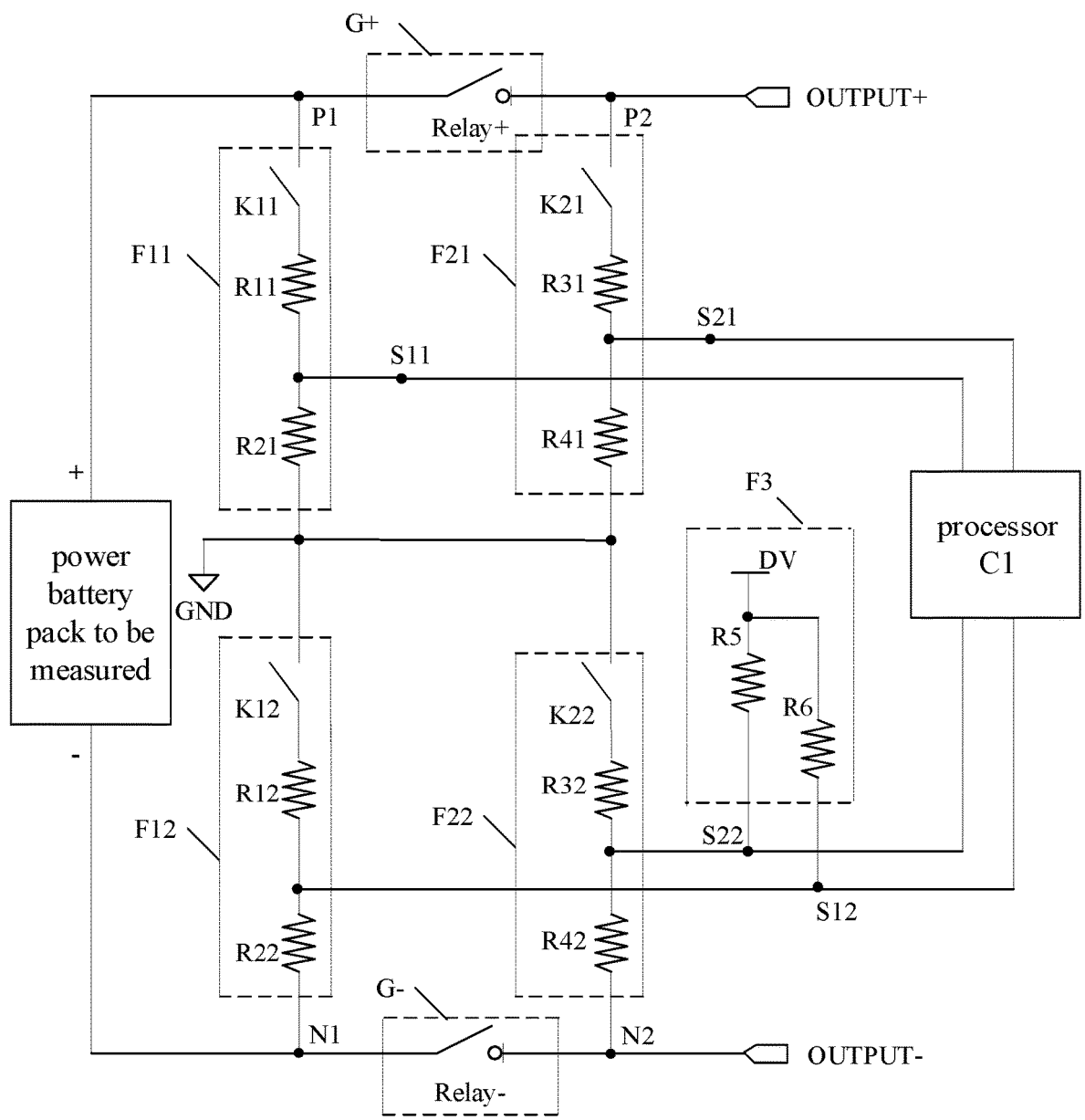
FIG. 5 is a schematic diagram showing a structure in which a positive relay diagnosis circuit and a negative relay diagnosis circuit are combined together according to an embodiment of the present disclosure.

FIG. 5 is a schematic diagram showing a structure in which relay diagnosis circuits for a positive relay and a negative relay are combined. The combined circuit in FIG. 5 includes a first positive sampling unit F11, a second positive sampling unit F21, a first negative sampling unit F12, a second negative sampling unit F22, a first positive sampling point S11, a second positive sampling point S21, a first negative sampling point S12, a second negative sampling point S22, a reference voltage terminal GND, and a processor C1.

The first positive sampling unit F11 may include a switch K11, a resistor network R11, and a resistor network R21 which are connected in series.

A first end of the switch K11 is connected with positive electrode of the power battery pack to be measured and with a first end P1 of the positive relay G+. A second end of the switch K11 is connected with a first end of the resistor network R11. A second end of the resistor network R11 is connected with a first end of the resistor network R21 and with the first positive sampling point S11. A second end of the resistor network R21 is connected with the reference voltage terminal GND.

The second positive sampling unit F21 may include a switch K21, a resistor network R31, and a resistor network R41 which are connected in series.

A first end of the switch K21 is connected with a second end P2 of the positive relay G+. A second end of the switch K21 is connected with a first end of the resistor network R31. A second end of the resistor network R31 is connected with a first end of the resistor network R41 and with the second positive sampling point S21. A second end of the resistor network R41 is connected with the reference voltage terminal GND.

The first negative sampling unit F12 may include a switch K12, a resistor network R12, and a resistor network R22 which are connected in series.

A first end of the switch K12 is connected with the reference voltage terminal GND. A second end of the switch K12 is connected with a first end of the resistor network R12. A second end of the resistor network R12 is connected with a first end of the resistor network R22 and with the first negative sampling point S12. A second end of the resistor network R22 is connected with negative electrode of the power battery pack to be measured and with a first end N1 of the negative relay G−.

The second negative sampling unit F22 may include a switch K22, a resistor network R32, and a resistor network R42 which are connected in series.

A first end of the switch K22 is connected with the reference voltage terminal GND. A second end of the switch K22 is connected with a first end of the resistor network R32. A second end of the resistor network R32 is connected with a first end of the resistor network R42 and with the second negative sampling point S22. A second end of the resistor network R42 is connected with a second end N2 of the negative relay G−.

One end of each of the first positive sampling unit F11, the second positive sampling unit F21, the first negative sampling unit F12, and the second negative sampling unit F22 shown in FIG. 5 is connected to the reference voltage terminal GND. That is, one end of each of the first positive sampling unit F11, the second positive sampling unit F21, the first negative sampling unit F12, and the second negative sampling unit F22 is common grounded with low voltage. Such an arrangement may not only avoid reducing the accuracy of the sampled signal due to the introduction of the isolation unit, but also simplify the structure of the relay diagnosis circuit.

Figure 6:
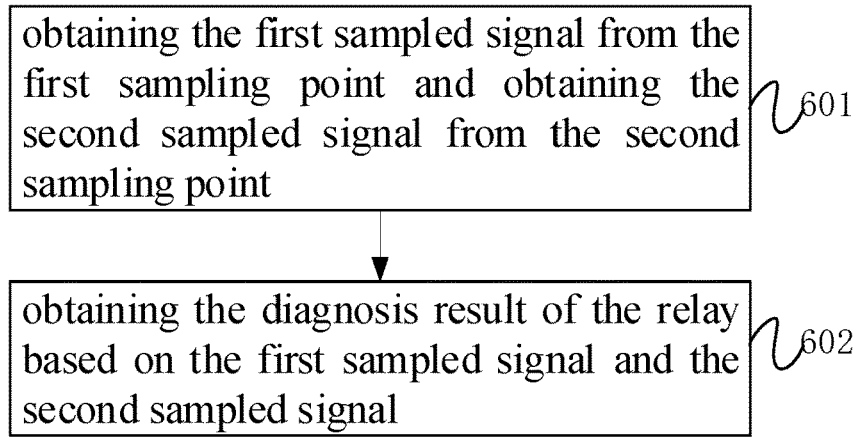
FIG. 6 is a flow chart of a diagnosis method for a relay diagnosis circuit according to an embodiment of the present disclosure.

FIG. 6 is a flow chart of a diagnosis method for a relay diagnosis circuit according to an embodiment of the present disclosure. As shown in FIG. 6, the diagnosis method may include steps 601 and 602.

In step 601, a first sampled signal is obtained from the first sampling point S1, and a second sampled signal is obtained from the second sampling point S2.

In step 602, diagnosis result of the relay G is obtained based on the first sampled signal and the second sampled signal.

The first sampled signal and the second sampled signal may be obtained in conjunction with the ON state and OFF state of the first switch K1 and the second switch K2.

Specifically, both of the first switch K1 and the second switch K2 may be in the ON state at the same time to obtain the first sampled signal from the first sampling point S1 and obtain the second sampled signal from the second sampling point S2.

Figure 7:
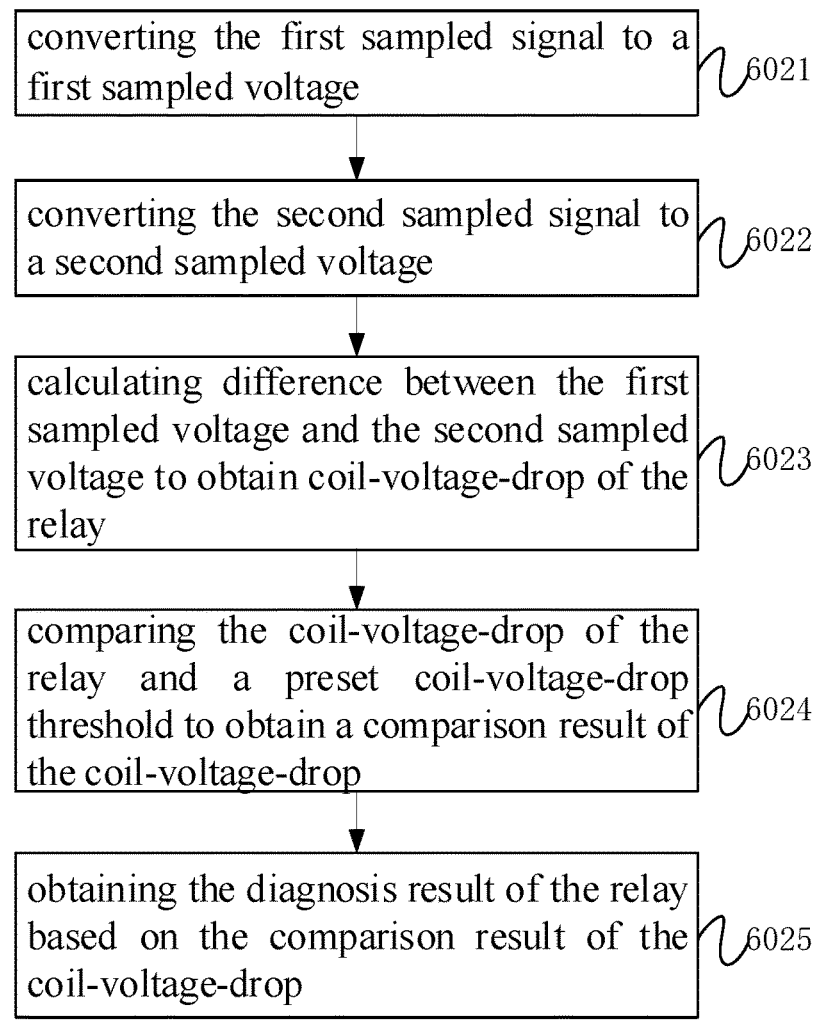
FIG. 7 is a flow chart of a diagnosis method for a relay diagnosis circuit according to another embodiment of the present disclosure.

FIG. 7 is a flow chart of a diagnosis method for a relay diagnosis circuit according to another embodiment of the present disclosure. Step 602 in FIG. 6 may be refined as steps 6021 to 6025 in FIG. 7.

In step 6021, the first sampled signal is converted to a first sampled voltage.

In step 6022, the second sampled signal is converted to a second sampled voltage.

In step 6023, the difference between the first sampled voltage and the second sampled voltage is calculated to obtain the coil-voltage-drop of the relay G.

In step 6024, the coil-voltage-drop of the relay G is compared with a preset coil-voltage-drop threshold to obtain comparison result of the coil-voltage-drop.

In step 6025, the diagnosis result of the relay G is obtained based on the comparison result of the coil-voltage-drop.

Diagnosis process for the positive relay G+ and the negative relay G− of the power battery pack to be measured will be described in detail below with reference to FIG. 5.

Diagnosis process for the positive relay G+ of the power battery pack to be measured may be as follows.

Sampled voltages $U_{SP1}$ and $U_{SP2}$ may be obtained by having K11 and K21 in ON state and having K12 and K22 in OFF state.

Values of the inside end voltage $U_{B+(inside)}$ and the outside end voltage $U_{B+(outside)}$ of the positive relay G+ of the power battery pack to be measured may be obtained respectively by applying the sampled voltages $U_{SP1}$ and $U_{SP2}$ into equations (1) and (2).

The coil-voltage-drop of the positive relay G+ of the power battery pack to be measured may be obtained by calculating absolute value of the difference between $U_{B+(inside)}$ and $U_{B+(outside)}$.

In an example, the preset coil-voltage-drop threshold for the positive relay G+ of the power battery pack to be measured is $U_{relay+}$. If $U_{relay+}$ meets equation (3), the positive relay G+ of the power battery pack to be measured may be determined to be normal; otherwise, the positive relay G+ of the power battery pack to be measured may be determined to have failure.

In particular, if the absolute value of the difference between $U_{B+(inside)}$ and $U_{B+(outside)}$ is less than or equal to $U_{relay+}$, the positive relay G+ of the power battery pack to be measured may be determined to be normal; if the absolute value of the difference between $U_{B+(inside)}$ and $U_{B+(outside)}$ is greater than $U_{relay+}$, the positive relay G+ of the power battery pack to be measured may be determined to be disconnected, and value of $U_{B+(outside)}$ is equal to 0.

Equations (1), (2) and (3) are as follows.

$$U_{B+(inside)} = \frac{U_{SP1}(R_{11} + R_{21})}{R_{21}} \quad (1)$$

$$U_{B+(outside)} = \frac{U_{SP2}(R_{31} + R_{41})}{R_{41}} \quad (2)$$

$$U_{B+(inside)} - U_{B+(outside)} \leq U_{relay+} \quad (3)$$

Diagnosis process for the negative relay G− of the power battery pack to be measured may be as follows.

Sampled voltages $U_{SP3}$ and $U_{SP4}$ may be obtained by having K11 and K21 in OFF state and having K12 and K22 in ON state.

Values of the inside end voltage $U_{B-(inside)}$ and the outside end voltage $U_{B-(outside)}$ of the negative relay G− of the power battery pack to be measured may be obtained respectively by applying the sampled voltages $U_{SP3}$ and $U_{SP4}$ into equations (4) and (5).

The coil-voltage-drop of the negative relay G− of the power battery pack to be measured may be obtained by calculating absolute value of the difference between $U_{B-(inside)}$ and $U_{B-(outside)}$.

In an example, the preset coil-voltage-drop threshold for the negative relay G− of the power battery pack to be measured is $U_{relay-}$. If $U_{relay-}$ meets equation (6), the negative relay G− of the power battery pack to be measured may be determined to be normal; otherwise, the negative relay G− of the power battery pack to be measured may be determined to occur failure.

In particular, if the absolute value of the difference between $U_{B-(inside)}$ and $U_{B-(outside)}$ is less than or equal to $U_{relay-}$, the negative relay G− of the power battery pack to be measured may be determined to occur adhesion; if the absolute value of the difference between $U_{B-(inside)}$ and $U_{B-(outside)}$ is greater than $U_{relay-}$, the negative relay G− of the power battery pack to be measured may be determined to be normal, and value of $U_{B-(outside)}$ is equal to 0.

Equations (4), (5) and (6) are as follows.

$$U_{B-(inside)} = \frac{U_{SP3}(R_{12} + R_{22})}{R_{12}} \quad (4)$$

$$U_{B-(outside)} = \frac{U_{SP4}(R_{32} + R_{42})}{R_{32}} \quad (5)$$

$$U_{B-(inside)} - U_{B-(outside)} \leq U_{relay-} \quad (6)$$

Optionally, $U_{SP3}$ and $U_{SP4}$ may be pulled up by the DC voltage source, and the negative relay G− may be diagnosed with the voltage collected after the pull-up.

The relay diagnosis circuit in FIG. 5 may also be used to perform high-voltage sampling for the inside end and the outside end of the positive relay G+ and the negative relay G− of the power battery pack to be measured respectively.

The process of high-voltage sampling for the inside end of the positive relay G+ and the negative relay G− of the power battery pack to be measured is as follows.

Sampled voltages $U_{SP1}$ and $U_{SP3}$ may be obtained by having K11 and K12 in ON state and having K21 and K22 in OFF state.

Values of the inside end voltage $U_{B+(inside)}$ of the positive relay G+ and the inside end voltage $U_{B-(inside)}$ of the negative relay G− of the power battery pack to be measured may be obtained respectively by applying the sampled voltages $U_{SP1}$ and $U_{SP3}$ into equations (7) and (8).

High-voltage sampling result at the inside end of the relay of the power battery pack to be measured (i.e., the value of the inside end voltage $U_{B(inside)}$ of the power battery pack to be measured) may be obtained by calculating sum of $U_{B+(inside)}$ and $U_{B-(inside)}$ (see equation 9).

Equations (7), (8) and (9) are as follows.

$$U_{B+(inside)} = \frac{U_{SP1}(R_{11} + R_{21})}{R_{21}} \quad (7)$$

$$U_{B-(inside)} = \frac{U_{SP3}(R_{12} + R_{22})}{R_{12}} \quad (8)$$

$$U_{B(inside)} = U_{B+(inside)} + U_{B-(inside)} \quad (9)$$

The process of high-voltage sampling for the outside end of the positive relay G+ and the negative relay G− of the power battery pack to be measured is as follows.

Sampled voltages $U_{SP2}$ and $U_{SP4}$ may be obtained by having K21 and K22 in ON state and having K11 and K12 in OFF state.

Values of the outside end voltage $U_{B+(outside)}$ of the positive relay G+ and the outside end voltage $U_{B-(outside)}$ of the negative relay G− of the power battery pack to be measured may be obtained respectively by applying the sampled voltages $U_{SP2}$ and $U_{SP4}$ into equations (10) and (11).

High-voltage sampling result at the outside end of the relay of the power battery pack to be measured (i.e., the value of the outside end voltage $U_{B(outside)}$ of the power battery pack to be measured) may be obtained by calculating sum of $U_{B+(outside)}$ and $U_{B-(outside)}$ (see equation 12).

Equations (10), (11) and (12) are as follows.

$$U_{B+(outside)} = \frac{U_{SP2}(R_{31} + R_{41})}{R_{41}} \quad (10)$$

$$U_{B-(outside)} = \frac{U_{SP4}(R_{32} + R_{42})}{R_{32}} \quad (11)$$

$$U_{B(outside)} = U_{B+(outside)} + U_{B-(outside)} \quad (12)$$

It should be noted that the processor C1 of embodiments of the present disclosure may be a processing device dedicated to the relay diagnosis circuit and/or the high-voltage sampling circuit, or may be a processing device common to other circuits. The diagnosis circuit and/or the sampling circuit may be separate circuit structures or may be part of the overall circuit structure.

Illustratively, the relay diagnosis circuit and/or the high-voltage sampling circuit in embodiments of the present disclosure may be integrated in the battery management system of the power battery pack. A part of the overall circuit structure of the battery management system may be used for relay diagnosis and/or inside and outside end high-voltage sampling for the power battery pack. A central processor of the battery management system may diagnose for the positive relay (relay+) and the negative relay (relay−) and perform high-voltage sampling for the inside and outside end of the relay of the power battery pack to be measured.

Figure 8:
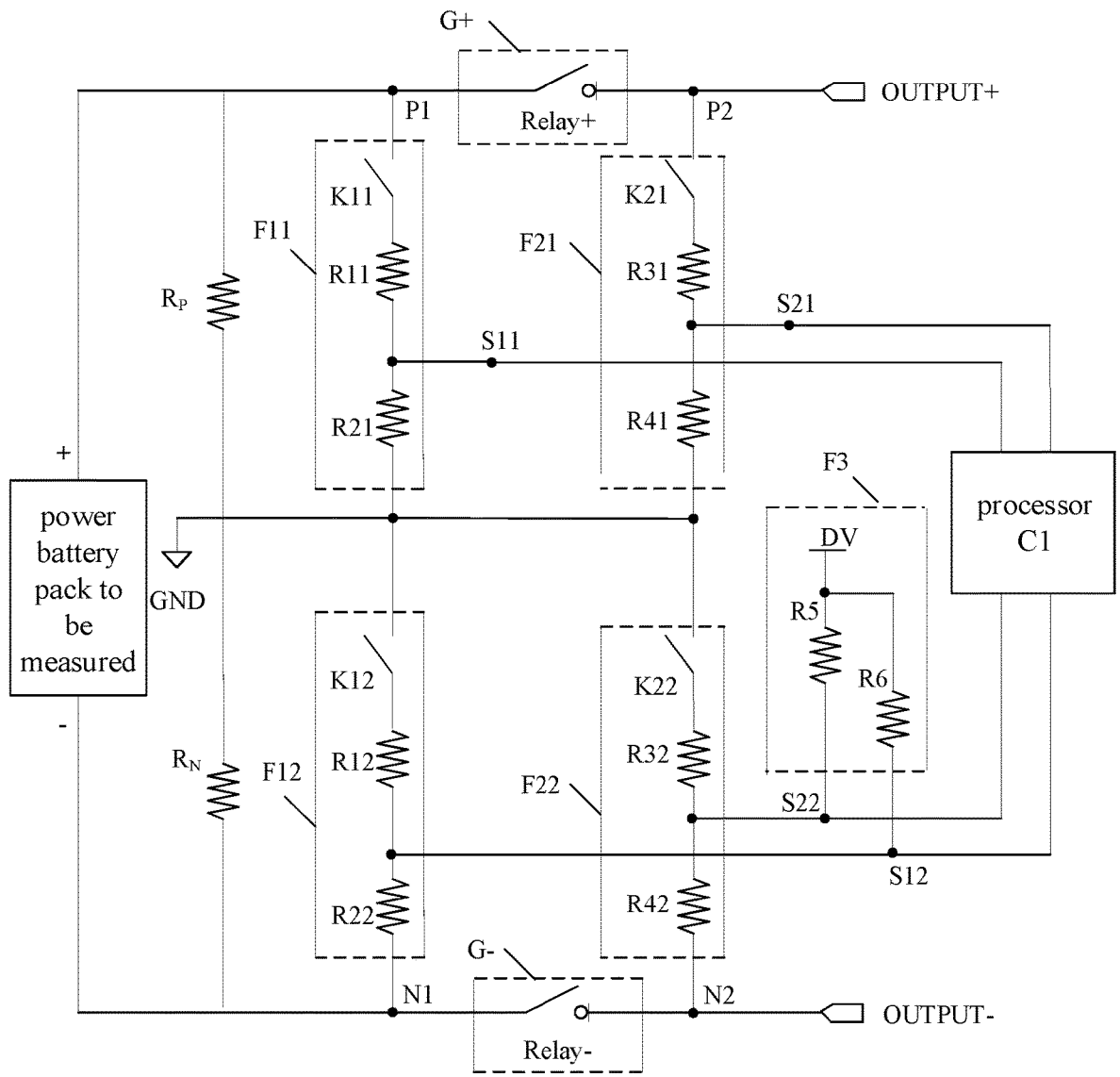
FIG. 8 is a structure diagram of a relay diagnosis circuit according to yet another embodiment of the present disclosure.

FIG. 8 is a structure diagram of a relay diagnosis circuit according to yet another embodiment of the present disclosure. The relay diagnosis circuit in FIG. 8 may include a first positive sampling unit F11, a second positive sampling unit F21, a first negative sampling unit F12, a second negative sampling unit F22, a first positive sampling point S11, a second positive sampling point S21, A first negative sampling point S12, a second negative sampling point S22, a reference voltage terminal GND, and a processor C1.

The first positive sampling unit F11 may include a switch K11, a resistor network R11, and a resistor network R21 which are connected in series.

A first end of the switch K11 is connected with positive electrode of the power battery pack to be measured and a first end P1 of a positive relay G+. A second end of the switch K11 is connected with a first end of the resistor network R11. A second end of the resistor network R11 is connected with a first end of the resistor network R21 and with the first positive sampling point S11. A second end of the resistor network R21 is connected with the reference voltage terminal GND.

The second positive sampling unit F21 may include a switch K21, a resistor network R31, and a resistor network R41 which are connected in series.

A first end of the switch K21 is connected with a second end P2 of the positive relay G+. A second end of the switch K21 is connected with a first end of the resistor network R31. A second end of the resistor network R31 is connected with a first end of the resistor network R41 and with the second positive sampling point S21. A second end of the resistor network R41 is connected with the reference voltage terminal GND.

The first negative sampling unit F12 may include a switch K12, a resistor network R12, and a resistor network R22 which are connected in series.

A first end of the switch K12 is connected with the reference voltage terminal GND. A second end of the switch K12 is connected with a first end of the resistor network R12. A second end of the resistor network R12 is connected with a first end of the resistor network R22 and with the first negative sampling point S12. A second end of the resistor network R22 is connected with negative electrode of the power battery pack to be measured and a first end N1 of a negative relay G−.

The second negative sampling unit F22 may include a switch K22, a resistor network R32, and a resistor network R42 which are connected in series.

A first end of the switch K22 is connected with the reference voltage terminal GND. A second end of the switch K22 is connected with a first end of the resistor network R32. A second end of the resistor network R32 is connected with a first end of the resistor network R42 and with the second negative sampling point S22. A second end of the resistor network R42 is connected with a second end N2 of the negative relay G−.

In FIG. 8, one end of each of the first positive sampling unit F11, the second positive sampling unit F21, the first negative sampling unit F12, and the second negative sampling unit F22 is connected with the reference voltage terminal GND. That is, one end of each of the first positive sampling unit F11, the second positive sampling unit F21, the first negative sampling unit F12, and the second negative sampling unit F22 is common-grounded with low voltage. Such an arrangement may not only avoid reducing the accuracy of the sampled signal due to the introduction of the isolation unit, but also simplify the structure of the insulation detection circuit.

According to an embodiment of the present disclosure, the relay diagnosis circuit in FIG. 8 may diagnose the positive relay and the negative relay of the power battery pack to be measured using the first positive sampling unit F11, the second positive sampling unit F21, the first negative sampling unit F12, and the second negative sampling unit F22.

According to an embodiment of the present disclosure, the relay diagnosis circuit shown in FIG. 8 may also measure insulation resistance of the power battery pack to be measured. FIG. 8 differs from FIG. 5 in that the relay diagnosis circuit in FIG. 8 shows positive insulation resistance value $R_p$ and negative insulation resistance value $R_n$ of the power battery pack to be measured. The insulation resistance of the power battery pack to be measured may be measured using the first positive sampling unit F11 and the first negative sampling unit F12, or using the second positive sampling unit F21 and the second negative sampling unit F22 of the relay diagnosis circuit according to the embodiments of the present disclosure.

According to an embodiment of the present disclosure, the relay diagnosis circuit shown in FIG. 8 can also be used for high-voltage sampling for the power battery pack to be measured.

As described above, the circuit shown in FIG. 8 may integrate insulation detection function, relay diagnosis function, and high-voltage sampling function for the power battery pack to be measured. The circuit configuration in the embodiments of the present disclosure has the advantages of high accuracy and low cost as compared with the prior art in which a separate circuits are need to be designed for respective functions.

It is to be understood that various embodiments in the description are described in a progressive manner. The same or similar parts among various embodiments may be referred to each other. Different emphasis is placed on different embodiments. For device embodiments, reference may be made to the description of method embodiments for related parts. The embodiments of the present disclosure are not limited to specific steps and structures described above and shown in the drawings. A person skilled in the art may make various changes, modifications, and additions, or change the order of the steps after understanding the spirit of the present disclosure. Also, for the purpose of concision, detailed description of known technique is omitted herein.

It is to be understood, however, that the embodiments of the disclosure are not limited to the specific configurations and processes described above and shown in the drawings. Also, for the purpose of concision, detailed description of known technique is omitted herein. In the above embodiments, a number of specific steps are described and illustrated as examples. However, the processes of the embodiments of the present disclosure are not limited to the specific steps described and illustrated. A person skilled in the art may make various changes, modifications, and additions, or change the order of the steps after understanding the spirit of the present disclosure.

Function blocks illustrated in the above described structure diagram may be implemented as hardware, software, firmware, or combination thereof. When implemented in hardware, it may be, for example, an electronic circuit, Application Specific Integrated Circuit (ASIC), appropriate firmware, plug-in, function card, and the like. When implemented in software, elements of the present disclosure may be programs or code segments used to perform tasks as required. The programs or code segments may be stored in machine readable medium, or communicated over transmission medium or communication links through data signals carried in carriers. The "machine readable medium" may include any medium that can store or communication information. Examples of machine readable medium may include: an electronic circuit, a semiconductor memory device, a ROM, a flash drive, an Erasable ROM (EROM), a floppy, a CD-ROM, an optical disk, a hard disk, optic fiber medium, a radio frequency (RF) link, etc.

What is claimed is:

1. A relay diagnosis circuit for a power battery pack, comprising:
    a first sampling unit, a second sampling unit, a first sampling point, a second sampling point, a reference voltage terminal, and a processor,
    wherein a first end of the first sampling unit is connected with voltage output end of the power battery pack to be measured and a first end of a relay, a second end of the first sampling unit is connected with the reference voltage terminal and the first sampling point, and
    wherein the first sampling unit comprises a first switch, a first resistor network, and a second resistor network which are connected in series:
        wherein a first end of the first switch is connected with the voltage output end of the power battery pack to be measured and the first end of the relay, a second end of the first switch is connected with a first end of the first resistor network;
        wherein a second end of the first resistor network is connected with a first end of the second resistor network and the first sampling point; and
        wherein a second end of the second resistor network is connected with the reference voltage terminal;

the first sampling unit is configured to provide a first sampled signal for the first sampling point by having the first switch in ON state;

wherein a first end of the second sampling unit is connected with a second end of the relay, a second end of the second sampling unit is connected with the reference voltage terminal and the second sampling point, and wherein the second sampling unit comprises a second switch, a third resistor network, and a fourth resistor network which are connected in series:

wherein a first end of the second switch is connected with the second end of the relay, and a second end of the second switch is connected with a first end of the third resistor network;

wherein a second end of the third resistor network is connected with a first end of the fourth resistor network and the second sampling point; and wherein a second end of the fourth resistor network is connected with the reference voltage terminal;

the second sampling unit is configured to provide a second sampled signal for the second sampling point by having the second switch in ON state; and wherein the processor is connected with the first sampling point and the second sampling point respectively, and the processor is configured to obtain a diagnosis result of the relay based on the first sampled signal and the second sampled signal when both of the first switch and the second switch are in ON state.

2. The relay diagnosis circuit of claim 1, wherein when the relay is a negative relay, the relay diagnosis circuit further comprises a voltage pull-up unit which is connected with the first sampling point and the second sampling point.

3. The relay diagnosis circuit of claim 2, wherein the voltage pull-up unit comprises a DC voltage source, a fifth resistor network, and a sixth resistor network, wherein a first end of the fifth resistor network is connected with the DC voltage source, and a second end of the fifth resistor network is connected with the first sampling point;

wherein a first end of the sixth resistor network is connected with the DC voltage source, and a second end of the sixth resistor network is connected with the second sampling point; and wherein the voltage pull-up unit is configured to generate a pull-up voltage and pull the first and the second sampled signals up to positive voltage signals respectively using the pull-up voltage.

4. The relay diagnosis circuit of claim 1, wherein the relay diagnosis circuit further comprises a first analog-to-digital converter (ADC), wherein a first end of the first ADC is connected with the first sampling point and the second sampling point, a second end of the first ADC is connected with the processor, and the first ADC is configured to convert analog signals collected at the first sampling point and the second sampling point to digital signals.

5. A battery management system comprising a relay diagnosis circuit for a power battery pack, wherein the relay diagnosis circuit comprises:

a first sampling unit, a second sampling unit, a first sampling point, a second sampling point, a reference voltage terminal, and a processor, wherein a first end of the first sampling unit is connected with voltage output end of the power battery pack to be measured and a first end of a relay, a second end of the first sampling unit is connected with the reference voltage terminal and the first sampling point, and wherein the first sampling unit comprises a first switch, a first resistor network, and a second resistor network which are connected in series:

wherein a first end of the first switch is connected with the voltage output end of the power battery pack to be measured and the first end of the relay, a second end of the first switch is connected with a first end of the first resistor network;

wherein a second end of the first resistor network is connected with a first end of the second resistor network and the first sampling point; and wherein a second end of the second resistor network is connected with the reference voltage terminal;

the first sampling unit is configured to provide a first sampled signal for the first sampling point by having the first switch in ON state;

wherein a first end of the second sampling unit is connected with a second end of the relay, a second end of the second sampling unit is connected with the reference voltage terminal and the second sampling point, and wherein the second sampling unit comprises a second switch, a third resistor network, and a fourth resistor network which are connected in series:

wherein a first end of the second switch is connected with the second end of the relay, and a second end of the second switch is connected with a first end of the third resistor network;

wherein a second end of the third resistor network is connected with a first end of the fourth resistor network and the second sampling point; and wherein a second end of the fourth resistor network is connected with the reference voltage terminal;

the second sampling unit is configured to provide a second sampled signal for the second sampling point by having the second switch in ON state; and wherein the processor is connected with the first sampling point and the second sampling point respectively, and the processor is configured to obtain a diagnosis result of the relay based on the first sampled signal and the second sampled signal when both of the first switch and the second switch are in ON state.

6. The battery management system of claim 5, wherein when the relay is a negative relay, the relay diagnosis circuit further comprises a voltage pull-up unit which is connected with the first sampling point and the second sampling point.

7. The battery management system of claim 6, wherein the voltage pull-up unit comprises a DC voltage source, a fifth resistor network, and a sixth resistor network, wherein a first end of the fifth resistor network is connected with the DC voltage source, and a second end of the fifth resistor network is connected with the first sampling point;

wherein a first end of the sixth resistor network is connected with the DC voltage source, and a second end of the sixth resistor network is connected with the second sampling point; and wherein the voltage pull-up unit is configured to generate a pull-up voltage and pull the first and the second sampled signals up to positive voltage signals respectively using the pull-up voltage.

8. The battery management system of claim 5, wherein the relay diagnosis circuit further comprises a first analog-to-digital converter (ADC), wherein a first end of the first ADC is connected with the first sampling point and the second sampling point, a second end of the first ADC is connected with the processor, and the first ADC is configured to convert analog signals collected at the first sampling point and the second sampling point to digital signals.

\* \* \* \* \*